(12) United States Patent
Sawai et al.

(10) Patent No.: US 6,896,979 B2
(45) Date of Patent: May 24, 2005

(54) FILM FOR ORGANIC EL DEVICE AND AN ORGANIC EL DEVICE USING THE FILM

(75) Inventors: Yuichi Sawai, Hitachi (JP); Tomoji Oishi, Hitachi (JP); Yoshiyuki Kaneko, Hachioji (JP); Sukekazu Aratani, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/642,697

(22) Filed: Aug. 19, 2003

(65) Prior Publication Data

US 2004/0053070 A1 Mar. 18, 2004

Related U.S. Application Data

(63) Continuation of application No. 09/953,559, filed on Sep. 17, 2001, now Pat. No. 6,638,645.

(30) Foreign Application Priority Data

Mar. 5, 2001 (JP) ........................................ 2001-060446

(51) Int. Cl.$^7$ ................................................. H05B 33/04
(52) U.S. Cl. .................... 428/690; 428/917; 428/421; 428/447; 313/504; 313/512; 257/100
(58) Field of Search ................................. 428/690, 917, 428/421, 447; 313/504, 512; 257/100

(56) References Cited

U.S. PATENT DOCUMENTS

| | | | |
|---|---|---|---|
| 5,451,459 A | 9/1995 | Ogawa et al. | |
| 5,958,609 A | * 9/1999 | Ueda et al. | ................. 428/690 |
| 5,977,241 A | 11/1999 | Koloski et al. | |
| 6,068,884 A | 5/2000 | Rose et al. | |
| 6,268,695 B1 | 7/2001 | Affinito | |
| 6,413,645 B1 | 7/2002 | Graff et al. | |
| 6,492,026 B1 | 12/2002 | Graff et al. | |

FOREIGN PATENT DOCUMENTS

| | | |
|---|---|---|
| JP | 05-051460 | 3/1993 |
| JP | 1180934 | 3/1999 |
| JP | 11332979 | 12/1999 |

* cited by examiner

*Primary Examiner*—Dawn Garrett
(74) *Attorney, Agent, or Firm*—Antonelli, Terry, Stout & Kraus, LLP

(57) ABSTRACT

The present invention provides a film for use in organic EL device, having a sufficient gas-barrier property for protection of organic EL device, and an organic EL device structure using such a film. That is, the present invention provides a film for use in organic EL device, made of an organic inorganic hybrid material whose molecules have an organic skeletal moiety and an inorganic skeletal moiety and contain fluorine group and siloxane group.

10 Claims, 2 Drawing Sheets

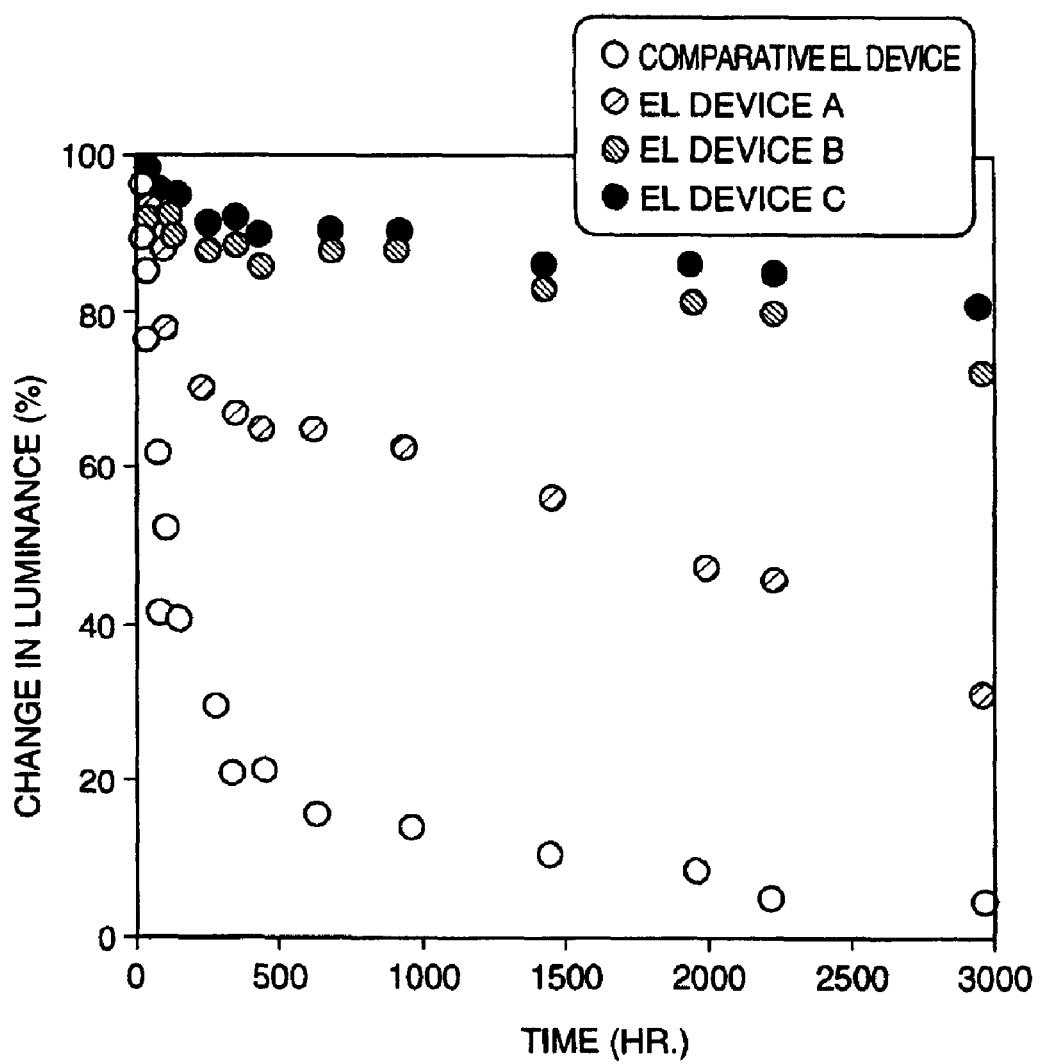

FILM FOR ORGANIC EL DEVICE AND AN ORGANIC EL DEVICE USING THE FILM

This application is a Continuation application of application Ser. No. 09/953,559, filed Sep. 17, 2001, now U.S. Pat. No. 6,638,645, the contents of which are incorporated herein by reference in their entirety.

BACKGROUND OF THE INVENTION

(1) Field of the Invention

The present invention relates to a film having a gas barrier property, effective for prevention of the deterioration of organic EL device caused by oxygen and moisture, as well as to an organic EL device using such a film.

(2) Related Art Statement

Electroluminescent (hereinafter abbreviated as EL) devices are a light-emitting device utilizing the light emission of a solid fluorescent substance or electroluminescence.

Currently, inorganic EL devices using an inorganic material as a light-emitting substance are put to practical use in, for example, the backlight or flat display of liquid crystal display.

For organic EL devices, active development and research works are under way based on a prospect that such devices can be produced by a simple process at a low cost. Organic solids which are used as the light-emitting layer, hole transport layer, etc. of organic EL device, are generally weak to moisture and oxygen and incur formation of dark spots and reduction in luminance. In order to obtain a reliable organic EL device, the device need be produced in an encapsulated device form which can hinder the penetration of moisture and oxygen into the organic material and electrode material used therein.

Various proposals have been made for the method for encapsulating of organic EL device. These proposals include, for example, a method of encapsulating an organic EL device with a metal together with a hygroscopic material, and a method of providing a glass sheet outside the back electrode of an organic EL device and filling a silicone oil between the back electrode and the glass sheet for encapsulating. Also proposed is a method of encapsulating an organic EL device using an organic film of excellent gas-barrier property or a film having a vapor-deposited inorganic oxide layer.

As to the film used for encapsulating of an organic EL device, there are disclosed organic films made of a polychlorotrifluoroethylene (PCTFE) or the like; and transparent gas-barrier films obtained by forming, on a plastic substrate, an inorganic oxide film made of $SiO_2$, $Al_2O_3$, MgO or the like, using physical vapor deposition (PVD) (e.g. vacuum vapor deposition, sputtering or ion plating) or chemical vapor deposition (CVD) (e.g. plasma chemical vapor deposition, thermal chemical vapor deposition or photochemical vapor deposition).

Organic polymers used for ordinary food packaging have an oxygen permeability of several tens to several hundreds $cc/(m^2 \cdot day)$ and a moisture permeability of several tens to several hundreds $g/(m^2 \cdot day)$. In contrast, organic polymers having a molecular structure having particularly a reinforced barrier property such as polychlorotrifluoroethylene (PCTFE) have an oxygen permeability of several $cc/(m^2 \cdot day)$ and a moisture permeability of several $g/(m^2 \cdot day)$.

Meanwhile, gas-barrier films obtained by forming, on a plastic substrate, an inorganic oxide film made of $SiO_2$, $Al_2O_3$, MgO or the like, using PVD or CVD are dense and, for example, a vapor-deposited $SiO_x$ film of 5 μm in thickness formed on a PET substrate of 30 μm in thickness has an oxygen permeability of about 1 $cc/(m^2 \cdot day)$ and a moisture permeability of about 1 $g/(m^2 \cdot day)$. It is disclosed in JP-A-11-80934 that an aluminum oxide/aluminum hydroxide composite film, which is obtained by a simple process of vapor-depositing $Al_2O_3$ on a plastic substrate, subjecting the surface of the resulting $Al_2O_3$ film to a plasma treatment with oxygen gas, and then introducing hydroxyl group into the $Al_2O_3$ film after plasma treatment, has an oxygen permeability of 1.2 $cc/(m^2 \cdot day)$ and a moisture permeability of 2.0 $g/(m^2 \cdot day)$. It is also disclosed in JP-A-11-332979 that a film, which is obtained by subjecting the surface of a PET substrate to a plasma treatment with oxygen gas and then forming thereon a vapor-deposited inorganic oxide film, has an oxygen permeability of 0.9 $cc/(m^2 \cdot day)$ and a moisture permeability of 0.8 $g/(m^2 \cdot day)$.

OBJECT OF THE INVENTION

The encapsulating material used in organic EL devices is required to have transparency and also a gas-barrier property which is higher than those possessed by conventional food packaging materials. Any of the above-mentioned gas-barrier organic films and vapor-deposited inorganic material films, however, has no sufficient gas-barrier property to encapsulate organic EL devices. In order to allow known gas-barrier organic films to have a gas-barrier property sufficient for encapsulating organic EL devices, it is necessary to allow them to have a larger thickness of about 10 cm. Vapor-deposited inorganic material films show as well a decrease in gas permeability by allowing them to have a larger thickness; however, when the thickness is 100 nm or more, the gas permeability reaches the minimum value and shows no further decrease. Thus, it is difficult to achieve a gas-barrier property sufficient for encapsulating organic EL devices by increasing the thickness of vapor-deposited inorganic material films. Therefore, it is not practical to use a conventional gas-barrier organic polymer film or a conventional vapor-deposited inorganic material film in an organic EL device, by increasing the thickness of the film.

Other methods for encapsulating an organic EL device were also proposed, but they have problems in obtaining a light and thin organic EL device.

The objects of the present invention are to provide a film for organic EL device, having a gas-barrier property sufficient for protection of organic EL device, and an organic EL device structure using such a film.

SUMMARY OF THE INVENTION

The present inventors made an extensive study in order to alleviate the above-mentioned problems. As a result, the present inventors found out that organic inorganic hybrid materials having fluorine group and siloxane group, for example, organic inorganic hybrid materials having a basic skeleton of polychlorofluoroethylene and containing an organic skeletal moiety and an inorganic skeletal moiety, have an excellent gas-barrier property. The present inventors further found out that a multi-layered sheet obtained by forming, on a plastic substrate, a film made of the above-mentioned organic inorganic hybrid material and a vapor-deposited inorganic material film has a higher gas-barrier property than only the organic inorganic hybrid material and that a laminate of a plurality of such multi-layered sheets has an even higher gas-barrier property. The above findings have led to the completion of the present invention.

The essence of the present invention lies in a film for use in organic EL device, made of an organic inorganic hybrid material whose molecules have an organic skeletal moiety and an inorganic skeletal moiety and contain fluorine group and siloxane group.

BRIEF DESCRIPTION OF THE DRAWINGS

FIG. 4 shows a change with time, of the luminance of an organic EL device encapsulated with the film of the present invention.

In FIGS. 1 to 3, numeral 1 refers to a PET substrate; numeral 2 refers to an organic inorganic hybrid material film; 3 refers to a vapor-deposited inorganic material layer; numeral 4 refers to an adhesive layer; numeral 5 refers to a glass substrate; numeral 6 refers to a metal cathode; numeral 7 refers to an organic EL layer; numeral 8 refers to an ITO electrode; numeral 9 refers to a passivation film made of an organic inorganic hybrid material.

DETAILED DESCRIPTION OF THE INVENTION

Figure 1:
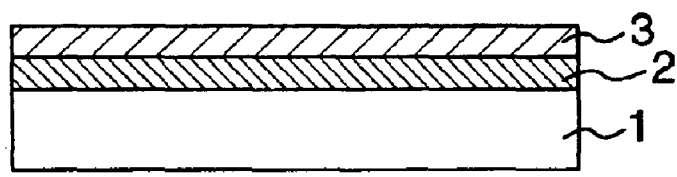
FIG. 1 shows a structure of the multi-layered film of the present invention comprising an inorganic layer and an organic inorganic hybrid layer.

The above-mentioned objects of the present invention can be achieved by using, in an organic EL device, a film made of an organic inorganic hybrid material whose molecules have an organic skeletal moiety and an inorganic skeletal moiety and contain fluorine group and siloxane group.

The organic inorganic hybrid material in the coating solution used for formation of a film for organic EL device is allowed to contain a photosensitive group for enabling film formation at low temperatures, a siloxane group for obtaining a film of high gas-barrier property, and a fluorine group for obtaining particularly a film of high moisture-barrier property. When the film formation temperature need not be low, the objects of the present invention can be achieved by using, for an organic EL device, a film-forming material made of an organic inorganic hybrid material having an organic skeletal moiety and an inorganic skeletal moiety and containing a polymer wherein siloxane group (which is an inorganic skeletal moiety) is bonded to a polychlorofluoroethylene (which is a main skeleton).

When there is used, in an organic EL device, a multi-layered film containing an inorganic layer and an organic inorganic hybrid layer and having a laminate structure wherein at least one organic inorganic hybrid material film (an organic inorganic hybrid layer) and at least one vapor-deposited inorganic material film (an inorganic layer) are laminated on a plastic substrate, the resulting organic EL device can have a higher reliability.

When at least two of the above multi-layered films are laminated, the resulting laminated film has a significantly improved gas-barrier property and can provide an organic EL device having an even higher reliability.

As the vapor-deposited inorganic material film, a dense film made of $SiO_x$ (x is 2 or less), $Al_2O_3$, MgO, $Si_3N_4$ or the like is appropriate. When an inorganic material (e.g. CaO) having hygroscopicity is further vapor-deposited on such a vapor-deposited inorganic material film, the resulting vapor-deposited inorganic material film has a plurality of functions (e.g. denseness and hygroscopicity) and becomes a film for organic EL device of higher reliability. The above-mentioned inorganic materials such as $SiO_x$, $Al_2O_3$, MgO, $Si_3N_4$ and CaO can exhibit the functions when they exist as a deposited film in a multi-layered film and also when they exist as fine particles in an organic inorganic hybrid layer. As the fine particle inorganic material, $SnO_2$ can also be used.

The film of the present invention is intended mainly for use in an organic EL device. Therefore, when an inorganic material of fine particles is dispersed in an organic inorganic hybrid layer, the inorganic material is allowed to have particle diameters equal to or less than the wavelength of visible light and is used in an amount of 5 to 50% by weight relative to the polymer of the hybrid layer, in order to obtain a transparent film for use in organic EL device.

By encapsulating an organic EL device at one side or both sides with the film of the present invention by, for example, using an adhesive having a gas-barrier property or employing heat lamination, a lightweight and thin organic EL device can be obtained.

The film of the present invention for use in organic EL device has a high gas-barrier property and moreover is transparent; therefore, it also allows production of an organic EL device of opposed substrate-free structure. By encapsulating an organic EL device with the present film in an inert gas having a pressure not lower than atmospheric pressure, to fill the inside of the resulting organic EL device with the inert gas having such a pressure, it is possible to allow the film and the adhesive used to have an improved apparent gas-barrier property and obtain an organic EL device having a higher reliability.

FIG. 1 is a conceptual view showing a film obtained by forming, on a PET material 1, an organic inorganic hybrid material film 2 by coating and, thereon, a vapor-deposited inorganic material layer 3 by CVD or the like. By thus forming a plurality of barrier layers, the resulting film has an increased barrier property. Although not shown in FIG. 1, the order of the hybrid film 2 and the inorganic layer 3 can be reversed.

Figure 2:
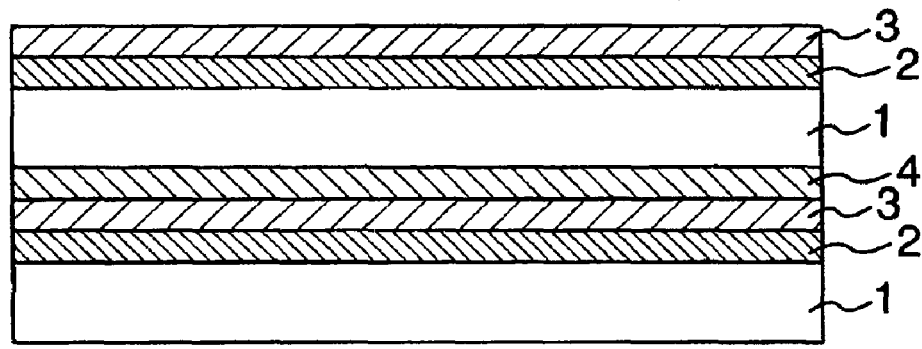
FIG. 2 shows a structure of the film of the present invention wherein two multi-layered films of FIG. 1 are laminated with each other.

FIG. 2 shows a film obtained by laminating two of the multi-layered film of FIG. 1 with each other via an adhesive layer 4. By laminating a plurality of multi-layered films of high barrier property, a film of higher barrier property can be obtained easily. By using such a film of high barrier property and transparency, the efficiency of taking light out from an organic EL device can be enhanced.

Figure 3:
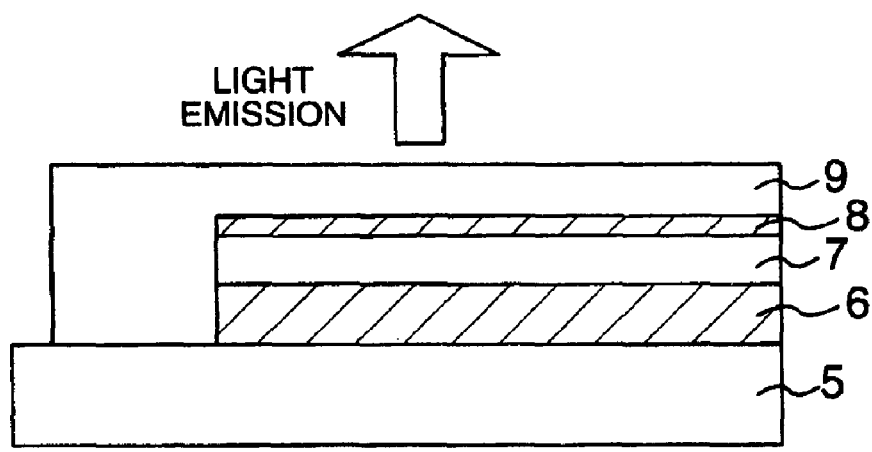
FIG. 3 shows a structure of an organic EL device encapsulated with the film of the present invention.

FIG. 3 shows an organic EL device using a barrier film 9 of the present invention. On a glass substrate 5 are laminated a metal cathode 6, an organic EL layer 7 and an ITO electrode 8 in this order.

In conventional organic EL devices, the above-mentioned elements were encapsulated with a metal can; therefore, the light emitted from the organic EL device was taken out from the glass substrate 5. Since the glass substrate had a TFT circuit formed thereon, the light was intercepted by the circuit, resulting in a low light taking-out efficiency.

When the present film is used as an encapsulating material, the light emitted by an organic EL device can be taken out from an organic inorganic passivation film 9 shown at the top of FIG. 3, without being intercepted, resulting in a high light taking-out efficiency.

DESCRIPTION OF PREFERRED EMBODIMENTS

The present invention is described in more detail below by way of Examples.

EXAMPLE 1

There was synthesized, as follows, an organic inorganic hybrid material to be used for forming, by coating, a film of the present invention for organic EL device.

There were mixed, in ethanol or isopropyl alcohol, component (A), $CF_3-(CH_2)_n-Si(OCH_3)_3$ (n=1 to 10), component (B), an alkoxy group-containing photosensitive acrylic resin, and component (C), $CH_2=CH-Si(OCH_3)_3$, at a molar ratio of (A):(B):(C)=1:1:1. Thereto were added a stoichiometric amount of water and a slight amount of an acid as a catalyst to give rise to hydrolysis of the alkoxy group of each component and a polycondensation reaction, whereby there was produced a solution of an organic inorganic hybrid material containing siloxane group, fluorine group and photosensitive group.

The organic inorganic hybrid material solution obtained above was coated on a PET substrate 1 having a thickness of 12 μm, as shown in FIG. 1. Then, an ultraviolet light (365 nm or 254 nm, 10 mW/cm$^2$) was applied for 10 minutes to give rise to photopolymerization of the photosensitive group of the hybrid material, whereby an organic inorganic hybrid material film 2 having a thickness of 1 μm was formed on the PET substrate at a low temperature.

For comparison, there was produced a film wherein a film of a polychlorotrifluoroethylene (PCTFE), in place of the organic inorganic hybrid material film, was formed, by coating, on the same PET substrate in a thickness of 1 μm.

Next, on each of the PET/organic inorganic hybrid material film, the PET/PCTFE film and the PET film (i.e. the PET substrate itself), there was formed, by vacuum deposition, a vapor-deposited inorganic material layer 3, i.e. a $SiO_x$ (X=2 or less) film, an $Al_2O_3$ film or a $SiO_x/Al_2O_3$ composite film, in a thickness of 50 nm. The resulting multi-layered films were used as samples for gas (oxygen or moisture) permeability test.

The multi-layered films were measured for oxygen permeability and moisture permeability as follows.

(1) Measurement Of Oxygen Permeability

Each of the multi-layered films produced above was measured for oxygen permeability using an oxygen permeability tester (OXTRAN 2/20) of U.S. MOCON Co., under the conditions of temperature=30° C., humidity=90% R.H. and pressure difference=0.1 MPa. The measurement limit of the tester was 0.01 cc/(m$^2$ ·day).

(2) Measurement Of Moisture Permeability

Each of the multi-layered films produced above was measured for moisture permeability using a moisture permeability tester (Permatran 2/20) of U.S. MOCON Co., under the conditions of temperature=30° C., humidity=90% R.H. and pressure difference=0.1 MPa. The measurement limit of the tester was 0.01 g/(m$^2$ ·day).

The results of measurements are shown in Table 1. As clear from Table 1, the PET/organic inorganic hybrid material film, i.e. the film No. 1-3 showed a higher gas-barrier property than the PET/PCTFE film, i.e. the film No. 1-2 and the PET/vapor-deposited inorganic material films, i.e. the film Nos. 2-1, 3-1 and 4-1. Combined use of a vapor-deposited inorganic material film and an organic inorganic hybrid material film, i.e. the film Nos. 2-3, 3-3 and 4-3 showed even higher gas barrier properties.

TABLE 1

| No. | Constitution of sample | Thickness (μm) | Oxygen permeability (cc/(m$^2$ · day)) | Moisture permeability (g/(m$^2$ · day)) |
|---|---|---|---|---|
| 1-1 | PET | 12.1 | 194 | 41 |
| 1-2 | PET/PCTFE | 13.3 | 75.2 | 2.2 |
| 1-3 | PET/organic inorganic hybrid material | 13.2 | 0.55 | 0.61 |
| 2-1 | PET/$SiO_x$ | 12.0 | 2.0 | 2.2 |
| 2-2 | PET/PCTFE/$SiO_x$ | 13.1 | 1.6 | 0.9 |
| 2-3 | PET/organic inorganic hybrid material/$SiO_x$ | 13.2 | 0.02 | 0.02 |
| 3-1 | PET/$Al_2O_3$ | 12.2 | 2.4 | 2.1 |
| 3-2 | PET/PCTFE/$Al_2O_3$ | 13.2 | 1.9 | 1.1 |
| 3-3 | PET/organic inorganic hybrid material/$Al_2O_3$ | 13.1 | 0.03 | 0.09 |
| 4-1 | PET/$SiO_x$ + $Al_2O_3$ | 12.0 | 1.9 | 2.2 |
| 4-2 | PET/PCTFE/$SiO_x$ + $Al_2O_3$ | 13.3 | 1.7 | 1.6 |
| 4-3 | PET/organic inorganic hybrid material/$SiO_x$ + $Al_2O_3$ | 13.3 | 0.05 | 0.08 |

EXAMPLE 2

Using each of the films used in Example 1, lamination of two or five same films was conducted using, as a sealant layer, an LLDPE film (TUX-TC) having a thickness of 5 μm, to produce various laminated films. These laminated films were measured for oxygen permeability and moisture permeability in the same manners as in Example 1. An example of the structures of these laminated films is shown in FIG. 2. In FIGS. 2, 4 refers to a sealant layer for laminating two same films. The oxygen and moisture permeabilities of the laminated films obtained by lamination of two same films are shown in Table 2, and the oxygen and moisture permeabilities of the laminated films obtained by lamination of five same films are shown in Table 3.

The laminated film, i.e. the sample No. 1-3, obtained by laminating two same multi-layered films containing an organic inorganic hybrid material, of the present invention, showed significantly reduced gas permeabilities as compared with the single multi-layered film before lamination. In all of the laminated films, i.e. the sample Nos. 2-3, 3-3 and 4-3, obtained by laminating two same multi-layered films further containing a vapor-deposited inorganic material layer, also of the present invention, the gas permeabilities were below the measurement limits of the testers.

In all of the laminated films obtained by laminating five same multi-layered films, of the present invention, the gas permeabilities were below the measurement limits of the testers. Even in these laminated films, the transparency was not substantially lost, indicating that they are suitable for use in organic EL devices.

In the present Example, gas barrier properties were evaluated for the laminated films obtained by laminating two or five same multi-layered films used in Example 1. However, there is no restriction as to the number of the multi-layered films to be laminated.

TABLE 2

| No. | Thickness (μm) | Oxygen permeability (cc/(m$^2$ · day)) | Moisture permeability (g/(m$^2$ · day)) |
|---|---|---|---|
| 1-1 | 28.5 | 98 | 25 |
| 1-2 | 31.2 | 38.0 | 1.3 |
| 1-3 | 31.3 | 0.23 | 0.29 |

TABLE 2-continued

| No. | Thickness ($\mu$m) | Oxygen permeability (cc/(m$^2$·day)) | Moisture permeability (g/(m$^2$·day)) |
|---|---|---|---|
| 2-1 | 28.9 | 1.1 | 1.2 |
| 2-2 | 31.0 | 0.7 | 0.6 |
| 2-3 | 30.9 | Below measurement limit | Below measurement limit |
| 3-1 | 29.0 | 1.2 | 0.9 |
| 3-2 | 31.5 | 1.1 | 0.4 |
| 3-3 | 31.4 | Below measurement limit | Below measurement limit |
| 4-1 | 29.1 | 1.0 | 1.2 |
| 4-2 | 31.0 | 0.9 | 0.8 |
| 4-3 | 31.2 | Below measurement limit | Below measurement limit |

TABLE 3

| No. | Thickness ($\mu$m) | Oxygen permeability (cc/(m$^2$·day)) | Moisture permeability (g/(m$^2$·day)) |
|---|---|---|---|
| 1-1 | 72.0 | 32 | 7.5 |
| 1-2 | 77.2 | 14.9 | 0.78 |
| 1-3 | 77.4 | Below measurement limit | Below measurement limit |
| 2-1 | 72.3 | 0.41 | 0.45 |
| 2-2 | 77.0 | 0.32 | 0.17 |
| 2-3 | 77.3 | Below measurement limit | Below measurement limit |
| 3-1 | 71.8 | 0.44 | 0.39 |
| 3-2 | 77.2 | 0.35 | 0.21 |
| 3-3 | 77.1 | Below measurement limit | Below measurement limit |
| 4-1 | 73.0 | 0.38 | 0.37 |
| 4-2 | 77.5 | 0.35 | 0.36 |
| 4-3 | 77.0 | Below measurement limit | Below measurement limit |

EXAMPLE 3

The coating solution containing an organic inorganic hybrid material, used in Example 1 was mixed with a SnO$_2$ dispersion to prepare, as coating dispsersions, six kinds of uniform dispersions containing 1, 5, 10, 30, 50 or 70% by weight of spherical SnO$_2$ fine particles (particle diameter= 200 nm). Each of these dispersions was coated on a PET film having a thickness of 25 $\mu$m, to prepare six kinds of film samples having a coating layer thickness of about 1 $\mu$m. The organic inorganic hybrid material film (in which spherical SnO$_2$ fine particles were dispersed) of each film sample was measured for oxygen and moisture permeabilities. The results are shown in Table 4. As clear from Table 4, the organic inorganic hybrid material films containing 5 to 50% by weight of dispersed SnO$_2$ fine particles showed improved oxygen and moisture permeabilities owing to the presence of dispersed SnO2 fine particles while retaining film transparency.

TABLE 4

| Amount of SnO$_2$ fine particles used (wt. %) | Thickness ($\mu$m) | Oxygen permeability (cc/(m$^2$·day)) | Moisture permeability (g/(m$^2$·day)) | Transparency |
|---|---|---|---|---|
| 1 | 26.1 | 0.55 | 0.62 | Transparent |
| 5 | 26.0 | 0.43 | 0.53 | Transparent |
| 10 | 26.3 | 0.31 | 0.40 | Transparent |
| 30 | 25.9 | 0.24 | 0.28 | Transparent |
| 50 | 26.0 | 0.12 | 0.15 | Somewhat transparent |
| 70 | 26.1 | 0.10 | 0.15 | Lack in transparency |

EXAMPLE 4

Organic EL devices were produced using some of the laminated films each containing an organic inorganic hybrid material layer, obtained in Example 2 and shown in Table 2.

The organic EL device before encapsulating, used in the present Example was a laminate of a glass substrate 5, a metal cathode 6, an organic EL layer (green) 7 and an ITO electrode layer 8 in this order, as shown in FIG. 3. The organic EL device was placed in a globe box under a nitrogen atmosphere of 1 atm. (0.1 MPa.). Onto the ITO electrode of the organic EL device (15 mm×20 mm) was bonded, using an adhesive, an organic inorganic hybrid material passivation film 9 (the film No. 1-3 of Table 2) cut into a size of 40 mm×50 mm, to encapsulate the organic EL device. The encapsulated EL device was named EL device A. Similar encapsulating was conducted with the film No. 2-3 of Table 2 to produce EL device B. By encapsulating of an organic EL device with the film No. 1-1 of Table 2, a comparative EL device was produced.

Similar encapsulating was conducted with the film No. 2-3 of Table 2 with the nitrogen pressure in the globe box changed to 2 atm. (0.2 MPa), to produce EL device C.

These EL devices were placed in a humid air of 50° C. and 90% R.H. and then connected to an AC source of 100 V and 400 Hz for continuous lighting, to measure their changes of luminance with time (the luminance right after lighting was taken as 100%). The results are shown in FIG. 4. The change (reduction) in luminance was small in the order of EL device C (smallest), EL device B and EL device A, as compared with that of the comparative EL device. Thus, an organic EL device having improved reliability can be obtained by using, as an encapsulating film, a film containing an organic inorganic hybrid material layer according to the present invention.

Further, by using, as an encapsulating film, a multi-layered film containing an organic inorganic hybrid material layer and a vapor-deposited inorganic material layer, an organic EL device having higher reliability can be obtained. By filling the inside of the encapsulated device with an inert gas having at least the atmospheric pressure, an organic EL device having even higher reliability can be obtained.

As clear from the above Examples, the present invention can provide a transparent passivation film having an excellent barrier property to oxygen and moisture. The passivation film provided by the present invention can be effectively used as a protective film for prevention of the deterioration of organic EL device caused by oxygen and moisture.

What is claimed is:

1. An organic EL device comprising a grass substrate, a metal cathode, an organic EL layer and an ITO electrode provided on the glass substrate, said ITO electrode being coated with a hybrid material film comprising molecules having an organic skeletal moiety and an inorganic skeletal moiety, wherein said hybrid material film comprises a material having fluorine group and siloxane group, the hybrid material film having a hybrid material film side opposite a side of the hybrid material film adjacent the ITO electrode, and light being emitted from the hybrid material film side.

2. An organic EL device according to claim 1, wherein the hybrid film contains not more than 30% by weight of inorganic particles.

3. An organic EL device according to claim 1, wherein the hybrid film has a thickness of 13.1–77.3 micrometer.

4. An organic EL device comprising a glass substrate, a metal cathode, an organic EL layer and an ITO electrode provided on the glass substrate, said ITO electrode being coated with a multi-layered film obtained by laminating (a) a hybrid material film and (b) at least one of a vapor-deposited inorganic material film and a plastic substrate, said hybrid material film comprising molecules having an organic skeletal moiety and an inorganic skeletal moiety, the hybrid material film having a hybrid material film side opposite a side of the hybrid material film adjacent the ITO electrode, and light being emitted from the hybrid material film side.

5. An organic EL device according to claim 4, wherein said multi-layered film is obtained by laminating the hybrid material film and the vapor-deposited inorganic material film.

6. An organic EL device according to claim 4, wherein said multi-layered film is obtained by laminating the hybrid material film, the vapor-deposited inorganic material film and the plastic substrate.

7. An organic EL device according to claim 6, wherein said multi-layered film further includes a lamination of a second film of said hybrid material film and the vapor-deposited inorganic material film, on the plastic substrate.

8. An organic EL device comprising a glass substrate, a metal cathode, an organic EL layer and an ITO electrode provided on the glass substrate, said ITO electrode being coated with a hybrid material film comprising molecules having an organic skeletal moiety and an inorganic skeletal moiety, wherein said hybrid material film comprises polychlorofluoroethylene having a siloxane group, the hybrid material film having a hybrid material film side opposite a side of the hybrid material film adjacent the ITO electrode, and light being emitted from the hybrid material film side.

9. An organic EL device according to claim 8, wherein the hybrid film contains not more than 30% by weight of inorganic particles.

10. An organic EL device comprising a glass substrate, a metal cathode, an organic EL layer and an ITO electrode provided on the glass substrate, said ITO electrode being coated with a hybrid material film comprising molecules having an organic skeletal moiety and an inorganic skeletal moiety, wherein the hybrid material film has a thickness of 13.1–77.3 micrometer, the hybrid material film having a hybrid material film side opposite a side of the hybrid material film adjacent the ITO electrode, and light being emitted from the hybrid material film side.

* * * * *